(12) United States Patent
Shimada (10) Patent No.: US 11,569,807 B2
(45) Date of Patent: Jan. 31, 2023

(54) VOLTAGE COMPARATOR CIRCUIT, POWER MANAGEMENT CIRCUIT, ELECTRONIC DEVICE

(71) Applicant: ROHM CO., LTD., Kyoto (JP)

(72) Inventor: Kazuaki Shimada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/583,684

(22) Filed: Jan. 25, 2022

(65) Prior Publication Data
US 2022/0255543 A1     Aug. 11, 2022

(30) Foreign Application Priority Data

Jan. 29, 2021  (JP) .............................. JP2021-013717

(51) Int. Cl.
*H03F 3/00*     (2006.01)
*H03K 5/24*     (2006.01)
*H02M 1/00*     (2006.01)

(52) U.S. Cl.
CPC .............. *H03K 5/24* (2013.01); *H02M 1/0045* (2021.05)

(58) Field of Classification Search
CPC .......... H03F 3/005; H03F 3/387; H03F 3/393; H03F 3/45475; H03F 3/45977; H03K 5/249; H03K 17/56
USPC .................................................... 327/63, 65
See application file for complete search history.

(56) References Cited

U.S. PATENT DOCUMENTS

| | | | | |
|---|---|---|---|---|
| 4,147,989 A | * | 4/1979 | Brolde | G06G 7/26 330/110 |
| 10,432,158 B1 | * | 10/2019 | Ide | H03F 3/387 |
| 2011/0249162 A1 | * | 10/2011 | Moore | H04N 5/3658 348/308 |
| 2011/0261177 A1 | * | 10/2011 | Moore | H04N 5/361 341/122 |
| 2016/0069960 A1 | * | 3/2016 | Kokorin | H03K 7/06 324/426 |
| 2018/0183456 A1 | * | 6/2018 | Lee | H03M 1/442 |

FOREIGN PATENT DOCUMENTS

| | | | |
|---|---|---|---|
| JP | H04351969 A | | 12/1992 |
| JP | 2017168968 A | * | 9/2017 |

* cited by examiner

*Primary Examiner* — Quan Tra
(74) *Attorney, Agent, or Firm* — Cantor Colburn LLP (57) ABSTRACT

The present disclosure provides a voltage comparator circuit, a power management circuit and an electronic device. The voltage comparator circuit compares a voltage difference between a positive electrode input terminal and a negative electrode input terminal with a threshold voltage. An amplifier circuit includes a first input node and a second input node, and amplifies a voltage difference between the first input node and the second input node. The input switch circuit, in a first phase, applies a predetermined voltage of one of the positive electrode input terminal and the negative electrode input terminal to the first input node and the second input node of the amplifier circuit; and in a second phase, applies a voltage of the positive electrode input terminal to the first input node of the amplifier circuit, and applies a voltage of the negative electrode input terminal to the second input node.

20 Claims, 5 Drawing Sheets

VOLTAGE COMPARATOR CIRCUIT, POWER MANAGEMENT CIRCUIT, ELECTRONIC DEVICE

CROSS REFERENCE TO RELATED APPLICATION

The present invention claims priority under 35 U.S.C. § 119 to Japanese Application, 2021-013717, filed on Jan. 29, 2021, the entire contents of which being incorporated herein by reference.

TECHNICAL FIELD

The present disclosure relates to a voltage comparator circuit.

BACKGROUND

In electronic circuits, a voltage comparator is used in order to compare size relationships of voltages. It is difficult to directly compare a minute voltage in several μV to hundreds mV with also a minute threshold voltage. Thus, in this case, an amplifier is arranged at a front end of the voltage comparator, the minute voltage is amplified by the amplifier, and the amplified voltage is then compared with a reference voltage by a voltage comparator.

PRIOR ART DOCUMENT

Patent Publication

[Patent document 1] Japan Patent Publication No. 4-351969

SUMMARY OF THE PRESENT DISCLOSURE

Problems to be Solved by the Disclosure

When a minute voltage is amplified by an amplifier, an input offset voltage of the amplifier cannot be overlooked. The input offset voltage of the amplifier in the situation above becomes the factor that degrades the precision of a voltage comparator circuit.

The disclosure is completed in view of the problem above. It is an illustrative object of one aspect of the disclosure to provide a voltage comparator circuit with improved precision.

Technical Means for Solving the Problem

An aspect of the disclosure relates to a voltage comparator circuit that compares a voltage difference between a positive electrode input terminal and a negative electrode input terminal with a threshold voltage. The voltage comparator circuit includes: an amplifier circuit, including a first input node and a second input node, and amplifying a voltage difference between the first input node and the second input node; an input switch circuit, in a first phase, applying a predetermined voltage of one of the positive electrode input terminal and the negative electrode input terminal to the first input node and the second input node of the amplifier circuit, and in a second phase, applying a voltage of the positive electrode input terminal to the first input node of the amplifier circuit, and applying a voltage of the negative electrode input terminal to the second input node; a chopper inverter type comparator; a voltage source, outputting a first voltage in the first phase and a second voltage in the second phase, wherein the second voltage has a voltage difference corresponding to the threshold voltage with respect to the first voltage; a first capacitor, having a first end connected to an output node of the amplifier circuit and a second end connected to an input node of the chopper inverter type comparator; and a second capacitor, having a first end connected to an output node of the voltage source and a second end connected to the input node of the chopper inverter type comparator.

Another aspect of the disclosure also relates to a voltage comparator circuit. The voltage comparator circuit includes: a positive electrode input terminal and a negative electrode input terminal; a first operational amplifier; a second operational amplifier, having a non-inverting input node connected to a reference voltage node; a first inverter; a second inverter; a digital/analog (D/A) converter; a first input switch and a first resistor, arranged in series between the positive electrode input terminal and an inverting input node of the first operational amplifier; a second input switch and a second resistor, arranged in series between the negative electrode input terminal and a non-inverting input node of the first operational amplifier; a third input switch, disposed between the positive electrode input terminal and a connection node of the second input switch and the second resistor; a third resistor, disposed between the inverting input node of the first operational amplifier and an output node of the first operational amplifier; a fourth resistor, disposed between the non-inverting input node and a reference voltage node of the first operational amplifier; a fifth resistor, disposed between the output node of the first operational amplifier and an inverting input node of the second operational amplifier; a sixth resistor, disposed between the inverting input node of the second operational amplifier and an output node of the second operational amplifier; a first capacitor, disposed between the output node of the second operational amplifier and an input node of the first inverter; a second capacitor, disposed between an output node of the D/A converter and the input node of the first inverter; a first switch, disposed between the input node of the first inverter and an output node of the first inverter; a second switch, disposed between an input node and an output node of the second inverter; a third capacitor, disposed between the output node of the first inverter and the input node of the second inverter; and a controller, (i) in a first phase, inputting a first code to the D/A converter to turn on the first input switch, turn off the second input switch, turn on the third input switch, or turn on the first switch and the second switch, and (ii) in the first phase, inputting a second code to the D/A converter to turn on the first input switch, turn on the second input switch, turn off the third input switch, or turn off the first switch and the second switch.

Moreover, any combination of the elements above, and any embodiments by conversions between expressions of methods and devices of the disclosure may also effectively serve as embodiments of the disclosure.

Effects of the Disclosure

According to an aspect of the disclosure, precision can be improved.

DETAILED DESCRIPTION OF THE EMBODIMENTS

Summary of Embodimnts

A summary of several embodiments of the disclosure is given below. The summary serves as the preamble of the detailed description to be given shortly, and aims to provide fundamental understanding of the embodiments by describing several concepts of one or more embodiments in brief. It should be noted that the summary is not to be construed as limitations to the scope of the disclosure. Moreover, the summary does not necessarily encompass all conceivable and possible embodiments, and does not provide specific definitions for essential constituent elements of the embodiments. For the sake of better description, "one embodiment" sometimes refers to one embodiment (implementation example or variation example) or multiple embodiments (implementation examples or variation examples) in the present disclosure.

According to an embodiment, a voltage comparator circuit compares a voltage difference between a positive electrode input terminal and a negative electrode input terminal with a threshold voltage. The voltage comparator circuit includes: an amplifier circuit, including a first input node and a second input node, and amplifying a voltage difference between the first input node and the second input node; an input switch circuit, in a first phase, applying a predetermined voltage of one of the positive electrode input terminal and the negative electrode input terminal to the first input node and the second input node of the amplifier circuit, and in a second phase, applying a voltage of the positive electrode input terminal to the first input node of the amplifier circuit, and applying a voltage of the negative electrode input terminal to the second input node; a chopper inverter type comparator; a voltage source, outputting a first voltage in the first phase and a second voltage in the second phase, wherein the second voltage has a voltage difference corresponding to the threshold voltage with respect to the first voltage; a first capacitor, having a first end connected to an output node of the amplifier circuit and a second end connected to an input node of the chopper inverter type comparator; and a second capacitor, having a first end connected to an output node of the voltage source and a second end connected to the input node of the chopper inverter type comparator.

According to the configuration above, influences of an offset of an amplifier circuit can be eliminated, thereby comparing at high precision a minute voltage difference between the positive electrode input terminal and the negative electrode input terminal.

In one embodiment, the chopper inverter type comparator may include: a first inverter; a second inverter; a first switch, disposed between an input node and an output node of the first inverter, and being turned on in the first phase and being turned off in the second phase; a second switch, disposed between an input node and an output node of the second inverter, and being turned on in the first phase and being turned off in the second phase; and a third capacitor, disposed between the output node of the first inverter and the input node of the second inverter.

In one embodiment, the amplifier circuit may include a first amplifier, and a second amplifier that amplifies an output of the first amplifier. A gain can be obtained by directly arranging the amplifiers in two stages.

In one embodiment, the first amplifier and the second amplifier may be inverting amplifiers. Accordingly, the overall amplifier circuit can achieve non-inverting amplification.

In one embodiment, the first amplifier may include: a first operational amplifier; a first resistor, disposed between the first input node and an inverting input node of the first operational amplifier; a second resistor, disposed between the second input node and a non-inverting input node of the first operational amplifier; a third resistor, disposed between the inverting input node of the first operational amplifier and an output node of the first operational amplifier; and a fourth resistor, disposed between a reference voltage node and the non-inverting input node of the first operational amplifier.

In one embodiment, the second amplifier may include: a second operational amplifier, having an inverting input node connected to the reference voltage node; a fifth resistor, disposed between an output node of the first amplifier and an inverting input node of the second operational amplifier; and a sixth resistor, disposed between the inverting input node of the second operational amplifier and an output node of the second operational amplifier.

In one embodiment, the input switch circuit may include: a first input switch, disposed between the positive electrode input terminal and the first input node of the amplifier circuit, and being turned on in the first phase and the second phase; a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

In one embodiment, the voltage comparator circuit includes: a positive electrode input terminal and a negative electrode input terminal; a first operational amplifier; a second operational amplifier, having a non-inverting input node connected to a reference voltage node; a first inverter; a second inverter; a digital/analog (D/A) converter; a first input switch and a first resistor, arranged in series between the positive electrode input terminal and an inverting input node of the first operational amplifier; a second input switch and a second resistor, arranged in series between the negative electrode input terminal and a non-inverting input node of the first operational amplifier; a third input switch, disposed between the positive electrode input terminal and a connection node of the second input switch and the second resistor; a third resistor, disposed between the inverting input node of the first operational amplifier and an output node of the first operational amplifier; a fourth resistor, disposed between the non-inverting input node and a reference voltage node of the first operational amplifier; a fifth resistor, disposed between the output node of the first operational amplifier and an inverting input node of the second operational amplifier; a sixth resistor, disposed between the inverting input node of the second operational amplifier and an output node of the second operational amplifier; a first capacitor, disposed between the output node of the second operational amplifier and an input node of the first inverter; a second capacitor, disposed between an output node of the D/A converter and the input node of the first inverter; a first switch, disposed between the input node of the first inverter and an output node of the first inverter; a second switch, disposed between an input node and an output node of the second inverter; a third capacitor, disposed between the output node of the first inverter and the input node of the second inverter; and a controller, (i) in a first phase, inputting a first code to the D/A converter to turn on the first input switch, turn off the second input switch, turn on the third input switch, or turn on the first switch and the second switch, and (ii) in the first phase, inputting a second code to the D/A converter to turn on the first input switch, turn on the second input switch, turn off the third input switch, or turn off the first switch and the second switch.

In one embodiment, the voltage comparator circuit may also be integrated on a semiconductor substrate. The so-called "integrated" includes a situation in which all constituting elements of a circuit are formed on a substrate, or a situation in which main constituting elements of a circuit are integrated on a semiconductor substrate. In order to adjust circuit constants, a part of resistors or capacitors may be arranged outside the semiconductor substrate. By integrating circuits on one chip, the circuit area is reduced and characteristics of circuit elements are kept uniform.

According to one embodiment, a power management circuit may include the voltage comparator circuit.

An electronic device according to an embodiment may include the power management circuit.

Embodiments

Details of the preferred embodiments of the disclosure are specifically given with the accompanying drawings below. The same or equivalent constituting elements, parts and processes in the drawings are represented by the same denotations, and repeated description is omitted as appropriate. It should be noted that the embodiments are non-limiting examples of the disclosure, and all features or combinations thereof described in the embodiments are not necessarily essentials of the disclosure.

In the description of the application, an expression "a state of component A connected to component B" includes, in addition to a situation where component A and component B are directly connected, a situation where component A is indirectly connected to component B via another component, and the indirect connection does not result in substantial influences on their electrical connection or does not impair functions or effects exerted by their connection.

Similarly, an expression "a state of component C arranged between component A and component B" includes, in addition to a situation where component A and component C, or component B and component C are directly connected, an indirect connection via another component, and the indirect connection does not result in substantial influences on their electrical connection or does not impair functions or effects exerted by their connection.

Moreover, in the description, denotations assigned to electrical signals such as voltage signals and current signals, and circuit elements such as resistors, capacitors and inductors are expressed with respective voltage values, current values or circuit constants (resistance values, capacitance values and inductance values) as needed.

Figure 1:
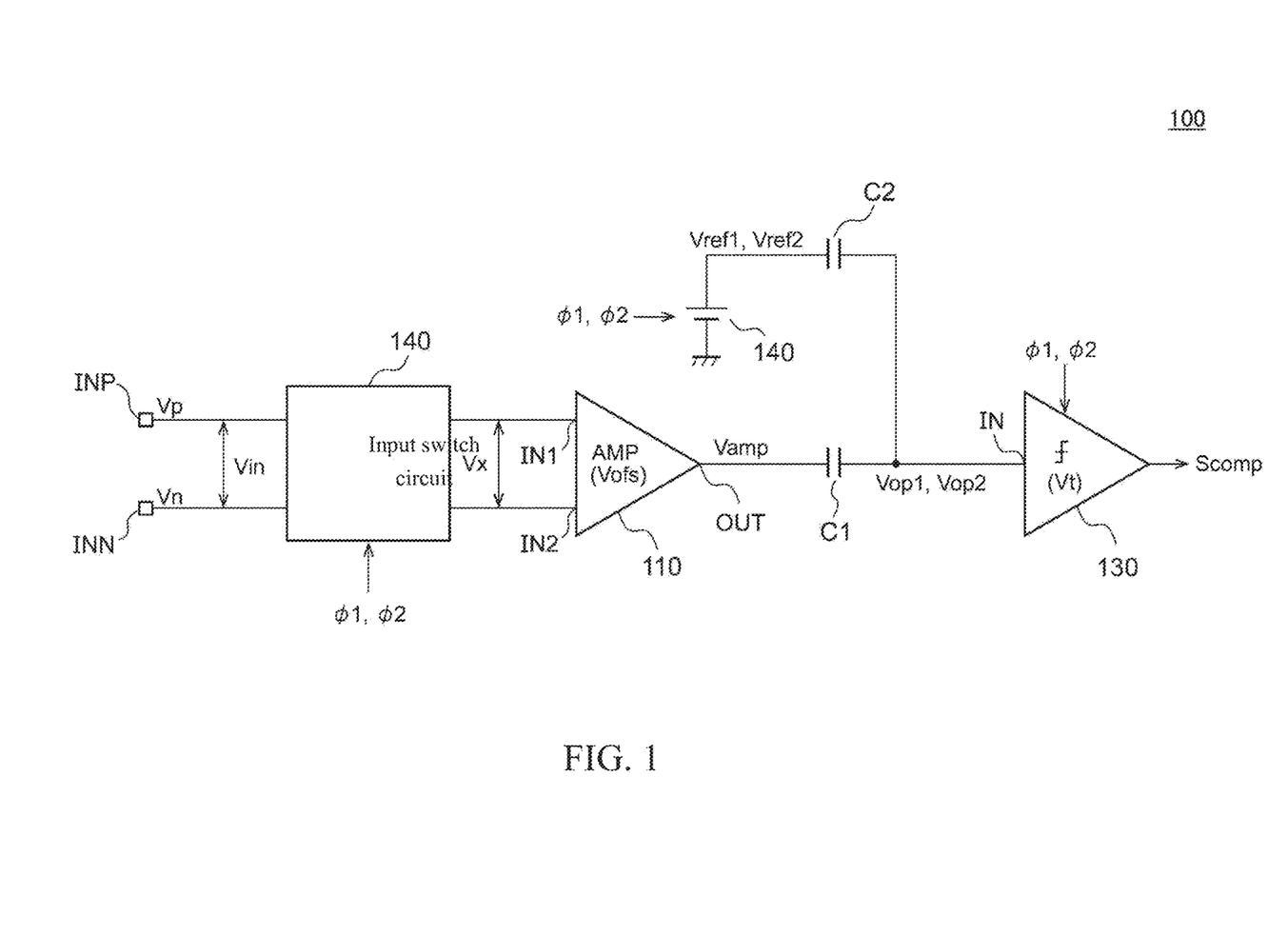
FIG. 1 is a circuit diagram of a voltage comparator circuit according to an embodiment.

FIG. 1 shows a circuit diagram of a voltage comparator circuit 100 according to an embodiment. The voltage comparator circuit 100 includes a positive electrode input terminal INP and a negative electrode input terminal INN, and compares a voltage difference Vin (=Vp−Vn) between potentials Vp and Vn of the positive electrode input terminal INP and the negative electrode input terminal INN with a threshold voltage Vth (not shown), and outputs a comparison signal Scomp indicating a size relationship thereof The voltage comparator circuit 100 includes an amplifier circuit 110, an input switch circuit 120, a chopper inverter type comparator 130 and a voltage source 140. The voltage comparator circuit 100 is integrated on a semiconductor substrate. The voltage comparator circuit 100 alternately repeats a first phase $\phi 1$ and a second phase $\phi 2$. In the first phase $\phi 1$, an error of the voltage comparator circuit 100 is corrected, and in the following second phase $\phi 2$, voltage comparison is performed. Thus, the first phase $\phi 1$ may be referred to as a correction phase, and the second phase $\phi 2$ may be referred to as a comparison phase.

The amplifier circuit 110 includes a first input node IN1 and a second input node IN2, and amplifies a voltage difference Vx between voltages at the first input node IN1 and the second input node IN2. The amplifier circuit 110 has a gain g and an input offset voltage Vofs. In sum, an output voltage Vamp of the amplifier circuit 110 is expressed as equation (1) below.

$$Vamp=g*(Vx+Vofs)+Vref \quad (1)$$

in which Vref is a reference voltage.

In the first phase $\phi 1$, the input switch circuit 120 applies a predetermined voltage of one of the positive electrode input terminal INP and the negative electrode input terminal INN to the first input node IN1 and the second input node IN2 of the amplifier circuit 110. In the second phase $\phi 2$, the input switch circuit 120 applies a voltage Vp of the positive electrode input terminal INP to the first input node IN1 of the amplifier circuit 110, and applies a voltage Vn of the negative electrode input terminal INN to the second input node IN2.

The chopper inverter type comparator 130 is a synchronous comparator, and is also referred to as a clocked comparator. The chopper inverter type comparator 130 performs voltage comparison in a predetermined clock-synchronous timing sequence. The chopper inverter type comparator 130 outputs the comparison signal Scomp in a high or low binary value according to the size relationship between an input voltage Vop1 in the first phase $\phi 1$ and an input voltage Vop2 in the second phase $\phi 2$. The chopper inverter type comparator 130 becomes the sampling phase in the first phase $\phi 1$, and becomes the comparison phase in the second phase $\phi 2$. In the sampling phase, the voltage Vopl at the input node IN of the chopper inverter type comparator 130 becomes the threshold voltage Vt of the chopper inverter type comparator 130, and the input node IN becomes low impedance.

In the comparison phase, the input node IN of the chopper inverter type comparator 130 becomes high impedance, and it is determined whether the input voltage Vop2 at this point is higher or lower than the previous input voltage Vop1=Vt. When Vop1>Vop2, the comparison signal Scomp is at a first level; when Vop1<Vop2, the comparison signal Scomp is at a second level. A designer may determine which between the first level and the second level is to be set as high and which is to be set as low.

The voltage source 140 outputs a first voltage Vref1 in the first phase φ1, and outputs a second voltage Vref2 in the second phase φ2. The second voltage Vref2 has a voltage difference ΔV corresponding to the threshold voltage Vth with respect to the first voltage Vref1.

$$\text{Vref2}=\text{Vref1}-\Delta V \quad (2)$$

The first capacitor C1 has a first end connected to an output node OUT of the amplifier circuit 110 and a second end connected to an input node IN of the chopper inverter type comparator 130. The second capacitor C2 has a first end connected to an output node of the voltage source 140 and a second end connected to the input node IN of the chopper inverter type comparator 130. The first capacitor C1 and the second capacitor C2 have equal capacitance C.

The configuration of the voltage comparator circuit 100 is as described above. The operation of the voltage comparator circuit 100 is to be described below.

(First Phase φ1)

In the first phase φ1, the voltage at the first input node IN1 and the voltage at the second input node IN2 of the amplifier circuit 110 are both Vp, and thus the voltage Vx between the two input nodes IN1 and IN2 of the amplifier circuit 110 is 0 V. At this point, an output voltage Vamp1 of the amplifier circuit 110 is expressed as equation (3) below.

$$\text{Vamp1}=g*\text{Vofs}+\text{Vref} \quad (3).$$

In the first phase φ1, the input voltage Vop1 of the chopper inverter type comparator 130 becomes a predetermined value Vt. Thus, in the first phase φ1, the amount of charge Q11 stored in the first capacitor C1 is expressed as equation (4).

$$Q11=(\text{Vamp1}-\text{Vop1})*C \quad (4).$$

Moreover, in the first phase φ1, the amount of charge Q21 stored in the second capacitor C2 is expressed as equation (5).

$$Q21=(\text{Vref1}-\text{Vop1})*C \quad (5)$$

(Second Phase φ2)

In the second phase φ2, the voltage at the first input node IN1 of the amplifier circuit 110 becomes Vp, and the voltage at the second input node IN2 becomes Vn. Thus, the voltage Vx between the two input nodes IN1 and IN2 of the amplifier circuit 110 becomes Vp−Vn=Vin. At this point, an output voltage Vamp2 of the amplifier circuit 110 is expressed as equation (6) below.

$$\text{Vamp2}=g*(\text{Vin}+\text{Vofs})+\text{Vref} \quad (6)$$

In the second phase φ2, the input node IN of the chopper inverter type comparator 130 becomes high impedance. In the second phase φ2, the input voltage of the chopper inverter type comparator 130 is set to Vop2.

In the second phase φ2, the amount of charge Q12 stored in the first capacitor C1 is expressed as equation (7).

$$Q12=(\text{Vamp2}-\text{Vop2})*C \quad (7)$$

In the second phase φ2, the amount of charge Q22 stored in the second capacitor C2 is expressed as equation (8).

$$Q22=(\text{Vref2}-\text{Vop2})*C \quad (8)$$

Because the total amount of charge in the two capacitors C1 and C2 in the first phase φ1 and the second phase φ2 is preserved, equation (9) is established.

$$Q11+Q21=Q12+Q22 \quad (9)$$

If equations (4), (5), (7) and (8) are substituted into equation (9), equation (10) is obtained.

$$(\text{Vamp1}-\text{Vop1})*C+(\text{Vref1}-\text{Vop1})*C=(\text{Vamp2}-\text{Vop2})$$
$$*C+(\text{Vref2}-\text{Vop2})*C \quad (10).$$

If equations (3) and (6) are substituted into equation (10) and organized, equation (11) is obtained.

$$g*\text{Vin}-\Delta V=2*(\text{Vop2}-\text{Vop1}) \quad (11)$$

The comparison signal Scomp output by the chopper inverter type comparator 130 is at a first level when Vop1>Vop2, in other words, when g*Vin−ΔV<0, i.e., g*Vin<ΔV<0. Moreover, the comparison signal Scomp output is at a second level when Vop1<Vop2, in other words, when g*Vin−ΔV>0, i.e., g*Vin>ΔV. The comparison signal Scomp refers to a comparison result between the voltage difference Vin between the two input terminals INP and INN and the threshold voltage Vth corresponding to ΔV/g.

The operation of the voltage comparator circuit 100 is as described above. According to the voltage comparison circuit 100, the input voltage Vin can be compared with the threshold Vth (Vth=ΔV/g), without being affected by the offset voltage Vofs of the amplifier circuit 110.

Various devices and methods of the disclosure related to the block diagram of FIG. 1, handling of circuit diagrams or derived from the description above are not limited to being specific configurations. To help better and more clearly understand the essentials and operations of the disclosure but not to narrow a scope of the disclosure, more specific configuration examples and embodiments are described below.

Figure 2:
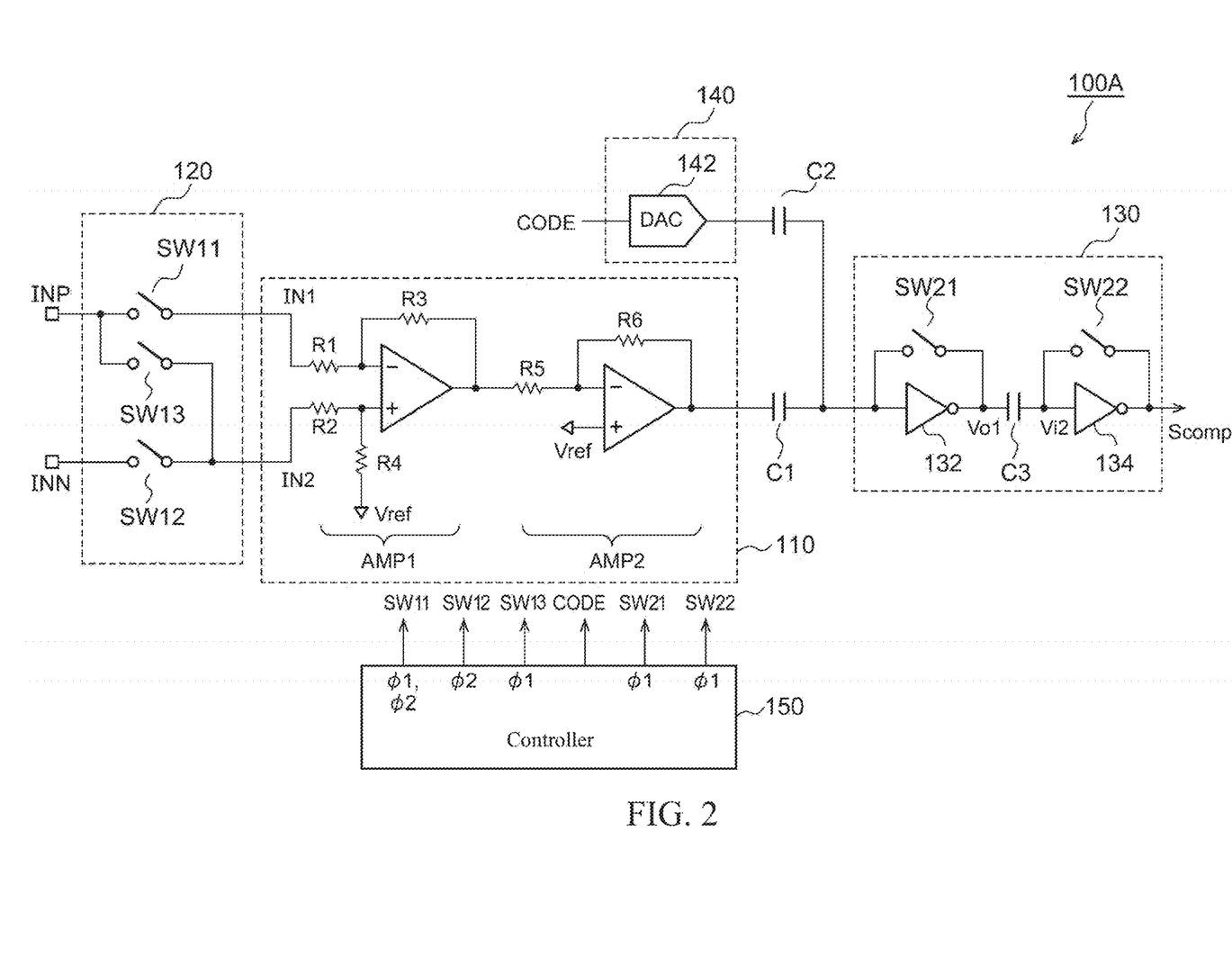
FIG. 2 is a circuit diagram of a voltage comparator circuit according to an embodiment.

FIG. 2 shows a circuit diagram of a voltage comparator circuit 100A according to an embodiment. A configuration example of the input switch 120 is first given below. The input switch circuit 120 includes a first input switch SW11 to a third input switch SW13. A first input switch SW11 is disposed between the positive electrode input terminal INP and the first input node IN1 of the amplifier circuit 110, and is turned on in the first phase φ1 and the second phase φ2. The second input switch SW12 is disposed between the negative electrode input terminal INN and the second input node IN2 of the amplifier circuit 110, and is turned on in the second phase φ2. The third input switch SW13 is disposed between the positive electrode input terminal INP and the second input node IN2 of the amplifier circuit 110, and is turned on in the first phase 41.

A configuration example of the amplifier circuit 110 is described below. The amplifier circuit 110 includes a first amplifier AMP1 and a second amplifier AMP2. The first amplifier AMP1 and the second amplifier AMP2 are inverting amplifiers. The voltage difference Vx between the two input nodes IN1 and IN2 is amplified by the front-end first amplifier AMP1, and the output voltage of the first amplifier AMP1 is further amplified by the back-end second amplifier AMP2. The offset voltage Vofs of the amplifier circuit 110 is a total offset of the two amplifiers AMP1 and AMP2. By connecting inverting amplifiers in two stages, the overall amplifier circuit 110 serves and functions as a non-inverting amplifier.

The first amplifier AMP1 includes a first operational amplifier OA1 and a first resistor R1 to a fourth resistor R4. The first resistor R1 is disposed between the first input node IN1 and an inverting input node of the first operational amplifier OA1. The second resistor R2 is disposed between the second input node IN2 and a non-inverting input node of the first operational amplifier OA1. The third resistor R3 is disposed between the inverting input node of the first operational amplifier OA1 and an output node of the first operational amplifier OA1. The fourth resistor R4 is disposed between a reference voltage node generating the reference voltage Vref and the non-inverting input node of the first operational amplifier OA1.

The second amplifier AMP2 includes a second operational amplifier OA2, and a fifth resistor R5 and a sixth resistor R6. The second operational amplifier OA2 has a non-inverting input node connected to a reference voltage node and applied with the reference voltage Vref The fifth resistor R5 is disposed between an output node of the first amplifier AMP1 and an inverting input node of the second operational amplifier OA2. The sixth resistor R6 is disposed between the inverting input node of the second operational amplifier OA2 and an output node of the second operational amplifier OA2.

A configuration example of the chopper inverter type comparator 130 is described below. The chopper inverter type comparator 130 includes a first inverter 132, a second inverter 134, a third capacitor C3, a first switch S21 and a second switch SW22. The first switch SW21 is disposed between an input node and an output node of the first inverter 132, and is turned on in the first phase ϕ1 and is turned off in the second phase ϕ2. The second switch SW22 is disposed between an input node and an output node of the second inverter 134, and is turned on in the first phase ϕ1 and is turned off in the second phase ϕ2. The third capacitor C3 is disposed between the output node of the first inverter 132 and the input node of the second inverter 134.

The operation of the chopper inverter type comparator 130 is to be described below. In the first phase ϕ1, if the first switch SW21 is turned on, the voltages at the input node and the output node of the first inverter 132 are equal to a threshold voltage Vt1 of the first inverter 132 due to a self-biased voltage of the first inverter 132. The voltage is the input voltage Vopl in the first phase ϕ1 in the description.

Regarding the back-end second inverter 134, likewise in the first phase ϕ1, if the second switch SW22 is turned on, the voltages at the input node and the output node of the second inverter 134 are equal to a threshold voltage Vt2 of the second inverter 134 due to a self-biased voltage of the second inverter 134. At this point, the third capacitor C3 is charged by the voltage difference ΔV=Vt2−Vt1.

In the second phase ϕ2, the first switch SW21 and the second switch SW22 are turned off. In the second phase ϕ2, if the input voltage Vop2 of the chopper inverter type comparator 130 is lower than Vt1, the output of the first inverter 132 is higher than Vt2; if the input voltage Vop2 is higher than Vt1, the output of the first inverter 132 is lower than Vt1. When a voltage gain of the first inverter 132 is set to Ga, the output voltage Vol of the first inverter 132 is Vol=Ga*(Vop2−Vt1)+Vt1

Since the charge of the third capacitor C3 is preserved, the voltage ΔV between two ends of the third capacitor C3 does not change from Vt1−Vt2, and an input voltage Vi2 of the second inverter 134 is Vi2=Vol+ΔV =Ga*(Vop2−Vt1)+Vt1−(Vt1−Vt2)

=Ga*(Vop2−Vt1)+Vt2

When a voltage gain of the second inverter 134 is set to Gb, the output voltage Vo2 of the second inverter 134 is expressed as the equation below.

Vo2=Gb*(Vi2−Vt2)+Vth2

=Ga*Gb*(Vop2−Vt1)+Vth2

If the gains Ga and Gb are sufficiently large, the output voltage Vo2 of the second inverter 134 becomes a binary signal. Moreover, an inverter for binarizing the voltage Vo2 may also be added at the back end of the second inverter 134.

A configuration example of the voltage source 140 is described below. The voltage source 140 includes a digital/analog (D/A) converter 142. For the D/A converter 142, a first code CODE1 is input in the first phase ϕ1, and a second code CODE2 is input in the second phase ϕ2.

The voltage comparator circuit 100A may further include a controller 150. The controller 150 controls the first input switch SW11 to the third input switch SW13, the first switch SW21, the second switch SW22 and an input code CODE of the D/A converter 142. The controller 150 may consist of logical circuits such as combinational circuits, sequential circuits, and combinational sequential circuits.

Variation Examples

Details of the embodiments of the disclosure are described as above. It should be understood that, the embodiments are exemplary, and various modifications may be made to combinations of the constituting elements and processes, and such modifications are to be encompassed within the scope of the disclosure. Details of such variation examples are given in the description below.

The amplifier circuit 110, the input switch circuit 120, the chopper inverter type comparator 130 and the voltage source 140 are not limited to the configurations in FIG. 2.

Figure 3A:
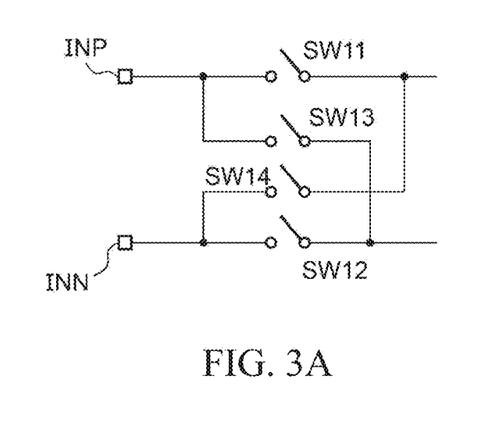
FIG. 3A and FIG. 3B are circuit diagrams of variation examples of an input switch circuit.
Figure 3B:
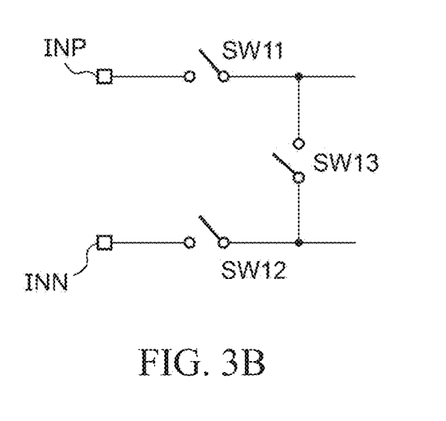

FIG. 3A and FIG. 3B show circuit diagrams of variation examples of the input switch circuit 120. The input switch circuit 120 in FIG. 3A further includes a fourth switch SW14. The fourth input switch SW14 is provided to enhance circuit symmetry, and is a dummy switch that is constantly turned off In the input switch circuit 120 in FIG. 3B, the position of the third input switch SW13 is different from that in FIG. 2, and the third input switch SW13 is disposed between the first input node IN1 and the second input node IN2 of the amplifier circuit 110.

In the first phase ϕ1, the input switch circuit 120 may also apply the voltage Vn of the negative electrode input terminal INN to the first input node IN1 and the second input node IN2 of the amplifier circuit 110. In this case, the third input switch SW13 in FIG. 2 is disposed between the negative electrode input terminal INN and the first input node IN1 of the amplifier circuit 110. Moreover, the output of the voltage source 140 in the first phase ϕ1 and the second phase ϕ2 only needs to satisfy equation (2') below.

$$Vref2=Vref1+\Delta V \qquad (2')$$

Figure 4A:
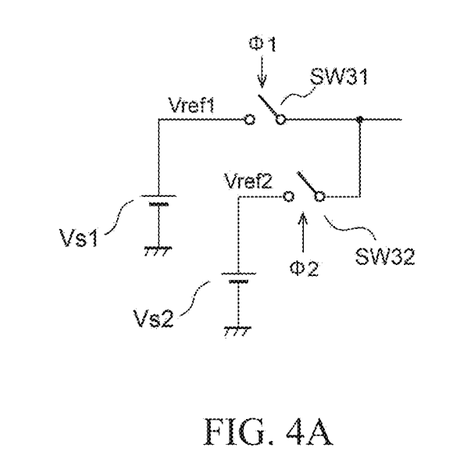
FIG. 4A and FIG. 4B are circuit diagrams of variation examples of a voltage source.

FIG. 4A and FIG. 4B show circuit diagrams of variation examples of the voltage source 140. The voltage source 140 in FIG. 4A includes two constant voltage sources VS1 and VS2, and two switched SW31 and SW32. The constant voltage source VS1 generates a first voltage Vref1, and the constant voltage source VS32 generates a second voltage Vref2. The switch SW31 is turned on in the first phase ϕ1, and the switch SW32 is turned on in the second phase ϕ2.

Figure 4B:
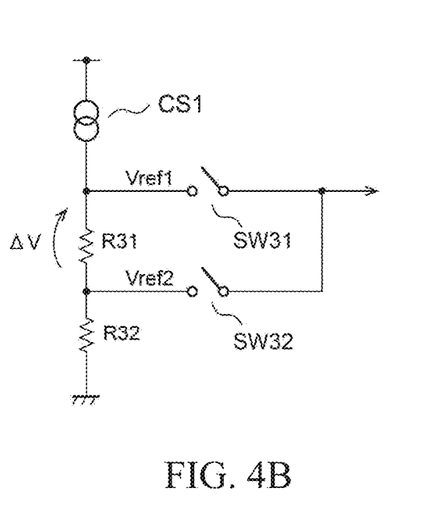

The voltage source 140 in FIG. 4B includes resistors R31 and R32, a current source CS1, and switches SW31 and SW32. The current source CS1 generates a constant current Ic.

$$Vref1=(R31+R32)*Ic$$

$$Vref2=R32*Ic$$

$$\Delta V=R31*Ic.$$

(Use).

Figure 5:
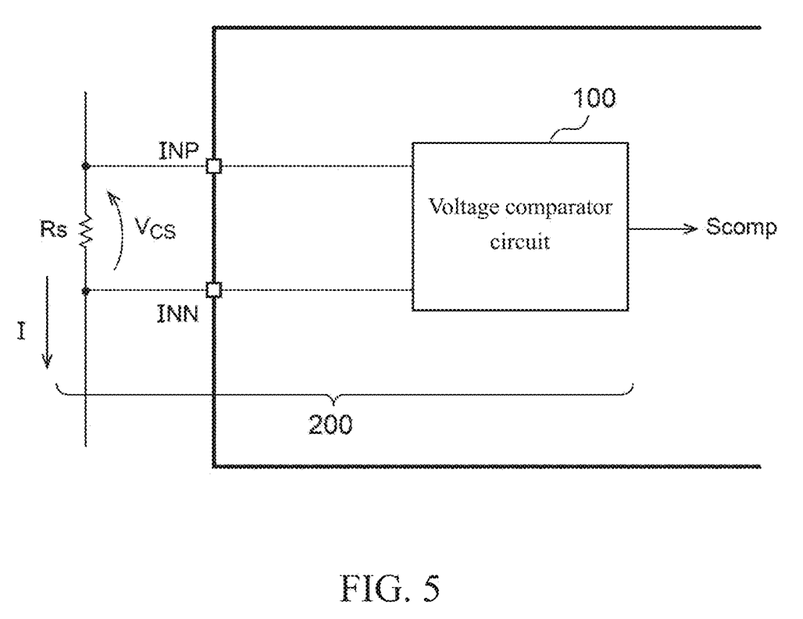
FIG. 5 is a peripheral circuit diagram of current detection circuit having a voltage comparator circuit.

Next, the use of the voltage comparator circuit 100 is described. The voltage comparator circuit 100 can be used for current detection. FIG. 5 shows a peripheral circuit diagram of current detection circuit 200 having the voltage comparator circuit 100. The voltage comparator circuit 100 and a sensing resistor Rs installed externally or integrated on the same integrated circuit together form the current detection circuit 200. The sensing resistor Rs is inserted on a path of a current I of a detection target. The positive electrode input terminal INP and the negative electrode input terminal INN of the voltage comparator circuit 100 are connected to one end on a high-potential side and the other end on a low-potential side of the sensing resistor Rs.

In the configuration above, a voltage drop Vsc=Rs*I proportional to the current I is generated at the sensing resistor Rs. The voltage comparator circuit 100 detects whether the voltage drop Vcs is higher than the predetermined threshold voltage Vth or lower than the predetermined threshold voltage Vth. The output Scomp of the voltage comparator circuit 100 is at a first level when the current I is greater than a threshold current Ith=Vth/Rs, and is at a second level when the current I is smaller than the threshold current Ith=Vth/Rs.

The voltage comparator circuit 100 can be used for, for example, current detection in a power management integrated circuit.

Figure 6:
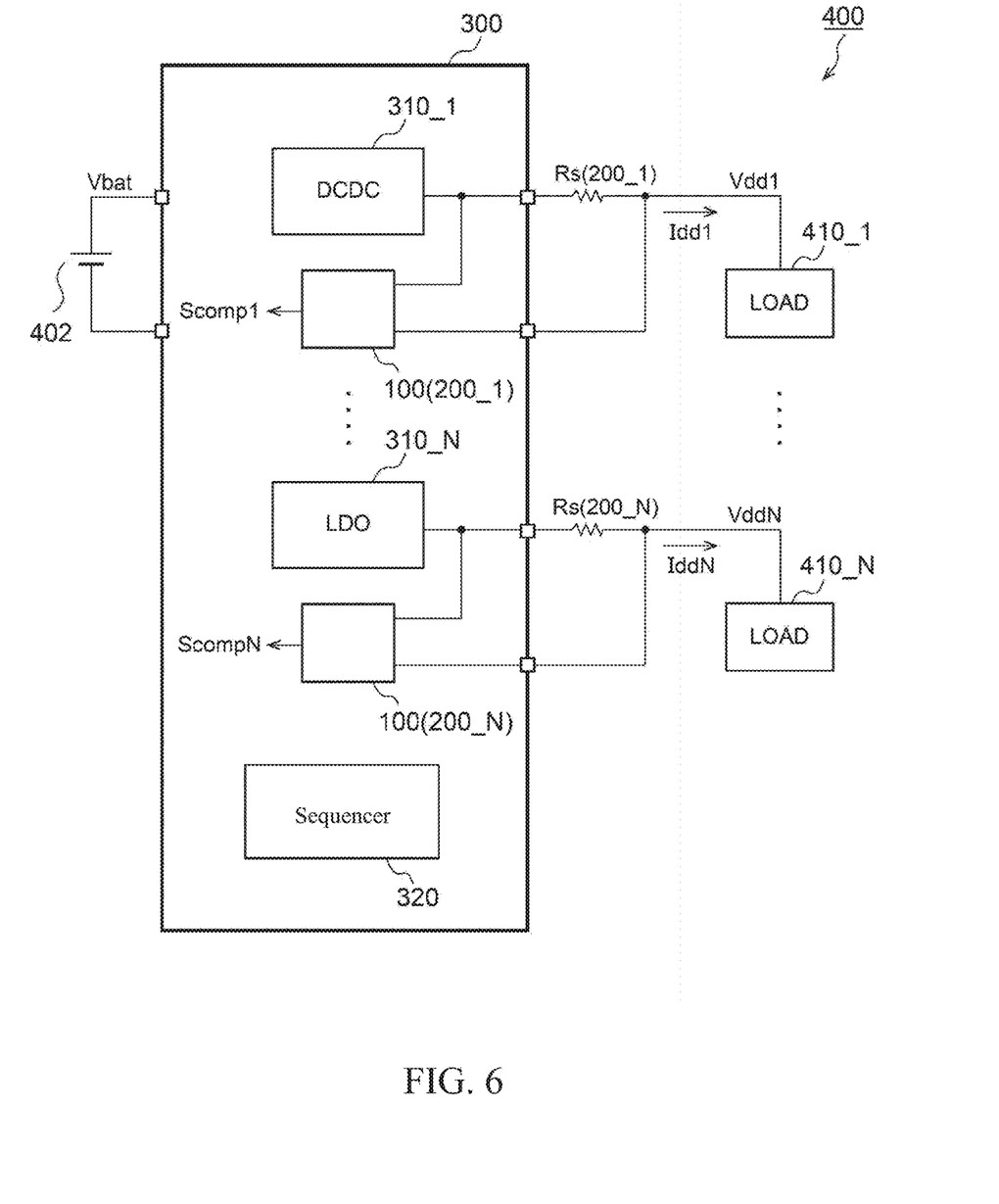
FIG. 6 is a block diagram of an electronic device having a power management integrated circuit (IC).

FIG. 6 shows a block diagram of an electronic device 400 having a power management integrated circuit 300. The electronic device 400 is a smartphone, a laptop computer, a digital camera, an audio player or an automobile navigation system. The electronic device 400 includes a battery 402, a power management integrated circuit 300, and N (N≥2) components serving as a plurality of loads 410_1 to 410_N. The power management integrated circuit 300 receives a battery voltage Vbat from a battery 402, and supplies appropriate power voltages Vdd1 to Vddn to the plurality of loads 410_1 to 410_N. The load 410 is a central processing unit (CPU), a microcomputer, a memory, various digital signal processors (DSP), a hard drive driver, a flash, a Universal Serial Bus (USB) interface, or a communication component.

The power management integrated circuit 300 includes a plurality of power circuits 310_1 to 310_N and a controller 320. Each power circuit 310_i (i=1~N) supplies the supply voltage Vddi at appropriate voltage level to the corresponding load 410_i. The power circuit 310 of a certain channel may also be a step-up, step-down, step-up-step-down direct-current/direct-current (DC/DC) converter. Moreover, the power circuit 310 of a certain channel may also be a linear regulator.

The controller 320 universally controls the plurality of power circuits 310_1 to 310_N. For example, the controller 320 has functions of a sequencer that controls on and off sequences and timings of the plurality of power circuits 310_1 to 310_N. Moreover, the controller 320 determines whether any abnormal event occurs in the power circuits 310_1 to 310_N and performs a protection process.

The power management integrated circuit 300 includes one or more current detection circuits 200 corresponding to one or more among the plurality of power circuits 310_1 to 310_N. The current detecting circuit 200 includes the sensing resistor Rs and the voltage comparator circuit 100 as shown in FIG. 5. The sensing resistor Rs may also be externally installed at the power management integrated circuit 300 as shown in FIG. 6. Alternatively, the sensing resistor Rs may be integrated in a semiconductor chip of the power management integrated circuit 300, or may be formed by using parasitic resistance of a bonding wire in a package or parasitic resistance of a lead frame of the power management integrated circuit 300.

In the current detecting circuit 200_i of a certain channel, the sensing resistor Rs is disposed on a path of a supply current Iddi of the corresponding load 410_i. The voltage comparator circuit 110_1 determines whether the supply current Iddi flowing in the load 410_i in the corresponding channel exceeds a predetermined threshold, and outputs a comparison signal Scompi to the controller 320. The current detecting circuit 200 may also be used to detect an overcurrent or be used to detect a disconnection. The controller 320 performs appropriate processing based on the comparison signal Scomp.

The power management integrated circuit may also be used in a device or system other than a battery-driven component.

Moreover, the current detection circuit 200 may be used in applications related to minute voltages or minute currents, and the use thereof is not limited to the examples given above.

The disclosure is described in detail by way of the specific terms and expressions in the embodiments. However, these embodiments are for conveying principles and applications of the disclosure, and variations and modifications to the configurations may be made to these embodiments without departing from the conceptive scope of the disclosure defined in the appended claims.

The invention claimed is:

1. A voltage comparator circuit, comparing a voltage difference between a positive electrode input terminal and a negative electrode input terminal with a threshold voltage, the voltage comparator circuit comprising:
   an amplifier circuit, including a first input node and a second input node, and amplifying a voltage difference between the first input node and the second input node;
   an input switch circuit,
      in a first phase, applying a predetermined voltage of one of the positive electrode input terminal and the negative electrode input terminal to the first input node and the second input node of the amplifier circuit,
      in a second phase, applying a voltage of the positive electrode input terminal to the first input node of the amplifier circuit, and applying a voltage of the negative electrode input terminal to the second input node;
   a chopper inverter type comparator;
   a voltage source, outputting a first voltage in the first phase and a second voltage in the second phase, wherein the second voltage has a voltage difference corresponding to the threshold voltage with respect to the first voltage;

a first capacitor, having a first end connected to an output node of the amplifier circuit and a second end connected to an input node of the chopper inverter type comparator; and a second capacitor, having a first end connected to an output node of the voltage source and a second end connected to the input node of the chopper inverter type comparator.

2. The voltage comparator circuit of claim 1, wherein the chopper inverter type comparator includes:

a first inverter;

a second inverter;

a first switch, disposed between an input node and an output node of the first inverter, and being turned on in the first phase and being turned off in the second phase;

a second switch, disposed between an input node and an output node of the second inverter, and being turned on in the first phase and being turned off in the second phase.

a third capacitor, disposed between the output node of the first inverter and the input node of the second inverter.

3. The voltage comparator circuit of claim 1, wherein the amplifier circuit includes:

a first amplifier; and a second amplifier, amplifying an output of the first amplifier.

4. The voltage comparator circuit of claim 2, wherein the amplifier circuit includes:

a first amplifier; and a second amplifier, amplifying an output of the first amplifier.

5. The voltage comparator circuit of claim 3, wherein the first amplifier includes:

a first operational amplifier;

a first resistor, disposed between the first input node and an inverting input node of the first operational amplifier;

a second resistor, disposed between the second input node and a non-inverting input node of the first operational amplifier;

a third resistor, disposed between the inverting input node of the first operational amplifier and an output node of the first operational amplifier; and a fourth resistor, disposed between a reference voltage node and the non-inverting input node of the first operational amplifier.

6. The voltage comparator circuit of claim 5, wherein the second amplifier includes:

a second operational amplifier, having an inverting input node is connected to the reference voltage node;

a fifth resistor, disposed between an output node of the first amplifier and an inverting input node of the second operational amplifier; and a sixth resistor, disposed between the inverting input node of the second operational amplifier and an output node of the second operational amplifier.

7. The voltage comparator circuit of claim 1, wherein the input switch circuit includes:

a first input switch, disposed between the positive electrode input terminal and the first input node of the amplifier circuit, and being turned on in the first phase and the second phase;

a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

8. The voltage comparator circuit of claim 2, wherein the input switch circuit includes:

a first input switch, disposed between the positive electrode input terminal and the first input node of the amplifier circuit, and being turned on in the first phase and the second phase;

a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

9. The voltage comparator circuit of claim 3, wherein the input switch circuit includes:

a first input switch, disposed between the positive electrode input terminal and the first input node of the amplifier circuit, and being turned on in the first phase and the second phase;

a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

10. The voltage comparator circuit of claim 4, wherein the input switch circuit includes:

a first input switch, disposed between the positive electrode input terminal and the first input node of the amplifier circuit, and being turned on in the first phase and the second phase;

a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

11. The voltage comparator circuit of claim 5, wherein the input switch circuit includes:

a first input switch, disposed between the positive electrode input terminal and the first input node of the amplifier circuit, and being turned on in the first phase and the second phase;

a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

12. The voltage comparator circuit of claim 6, wherein the input switch circuit includes:

a first input switch, disposed between the positive electrode input terminal and the first input node of the amplifier circuit, and being turned on in the first phase and the second phase;

a second input switch, disposed between the negative electrode input terminal and the second input node of the amplifier circuit, and being turned on in the second phase; and a third input switch, disposed between the positive electrode input terminal and the second input node of the amplifier circuit, and being turned on in the first phase.

13. A voltage comparator circuit, comprising:
a positive electrode input terminal and a negative electrode input terminal;
a first operational amplifier;
a second operational amplifier, having a non-inverting input node connected to a reference voltage node,
a first inverter;
a second inverter;
a D/A converter;
a first input switch and a first resistor, arranged in series between the positive electrode input terminal and an inverting input node of the first operational amplifier;
a second input switch and a second resistor, arranged in series between the negative electrode input terminal and a non-inverting input node of the first operational amplifier;
a third input switch, disposed between the positive electrode input terminal and a connection node of the second input switch and the second resistor;
a third resistor, disposed between the inverting input node of the first operational amplifier and an output node of the first operational amplifier;
a fourth resistor, disposed between the non-inverting input node and a reference voltage node of the first operational amplifier;
a fifth resistor, disposed between the output node of the first operational amplifier and an inverting input node of the second operational amplifier;
a sixth resistor, disposed between the inverting input node of the second operational amplifier and an output node of the second operational amplifier;
a first capacitor, disposed between the output node of the second operational amplifier and an input node of the first inverter;
a second capacitor, disposed between an output node of the D/A converter and the input node of the first inverter;
a first switch, disposed between the input node of the first inverter and an output node of the first inverter;
a second switch, disposed between an input node and an output node of the second inverter;
a third capacitor, disposed between the output node of the first inverter and the input node of the second inverter; and
a controller,
(i) in a first phase, inputting a first code to the D/A converter to
turn on the first input switch,
turn off the second input switch,
turn on the third input switch, or
turn on the first switch and the second switch, and
(ii) in the first phase, inputting a second code to the D/A converter to
turn on the first input switch,
turn on the second input switch,
turn off the third input switch, or
turn off the first switch and the second switch.

14. The voltage comparator circuit of claim 1, wherein the voltage comparator circuit is integrated on a semiconductor substrate.

15. The voltage comparator circuit of claim 2, wherein the voltage comparator circuit is integrated on a semiconductor substrate.

16. The voltage comparator circuit of claim 3, wherein the voltage comparator circuit is integrated on a semiconductor substrate.

17. A power management circuit, comprising the voltage comparator circuit of claim 1.

18. A power management circuit, comprising the voltage comparator circuit of claim 2.

19. A power management circuit, comprising the voltage comparator circuit of claim 3.

20. An electronic device, comprising the power management circuit of claim 17.

* * * * *